United States Patent [19]
Okumura et al.

[11] Patent Number: 5,237,821
[45] Date of Patent: Aug. 24, 1993

[54] MULTISTEP ELECTRONIC COOLER

[75] Inventors: Takuji Okumura; Masao Yamashita, both of Hiratsuka, Japan

[73] Assignee: Kabushiki Kaisha Komatsu Seisakusho, Tokyo, Japan

[21] Appl. No.: 795,271

[22] Filed: Nov. 20, 1991

Related U.S. Application Data

[63] Continuation of Ser. No. 465,258, filed as PCT/JP88/00828 on Aug. 19, 1988, abandoned.

[30] Foreign Application Priority Data

Aug. 20, 1987 [JP] Japan ................... 62-207204
Jul. 22, 1988 [JP] Japan ................... 63-181802

[51] Int. Cl.$^5$ .............................. F25B 21/02
[52] U.S. Cl. .................................... 62/3.2
[58] Field of Search ............ 62/3.1, 3.2, 3.5, 3.6

[56] References Cited

U.S. PATENT DOCUMENTS

| | | |
|---|---|---|
| 2,994,203 | 8/1961 | Lackey et al. |
| 3,088,288 | 5/1963 | Elfving |
| 3,118,285 | 1/1964 | Malaker et al. |
| 3,151,465 | 10/1964 | Gelbtuch et al. |
| 3,309,881 | 3/1967 | Beerman ................... 62/3.3 |
| 3,327,778 | 6/1967 | Lawrence, Jr. ........... 62/3.2 |
| 4,287,720 | 9/1981 | Barthel |
| 4,375,157 | 3/1983 | Boesen |
| 4,833,889 | 5/1989 | Harwell et al. ......... 62/3.2 |

FOREIGN PATENT DOCUMENTS

| | | |
|---|---|---|
| 0288022 | 10/1988 | European Pat. Off. |
| 1186086 | 1/1965 | Fed. Rep. of Germany |
| 36-23789 | 9/1961 | Japan |
| 39-15888 | 8/1964 | Japan |
| 40-30948 | 10/1965 | Japan |
| 60-240965 | 11/1985 | Japan |
| 1596549 | 8/1981 | United Kingdom |

OTHER PUBLICATIONS

"Guide to Thermoelectric Heat Pumps", Marlow Industries, Inc. pp. 8-14.

Primary Examiner—John M. Sollecito
Attorney, Agent, or Firm—Armstrong, Westerman, Hattori, McLeland & Naughton

[57] ABSTRACT

A multistep electronic cooler developed for the purpose of minimizing the incoming heat quantity generated by convective heat transfer and radiant heat transfer with a simple structure and bringing the maximum achievable cooling temperature to a level lower than that in a conventional electronic cooler of this kind at a low cost. The multistep electronic cooler according to the present invention has a plurality of base plates (3) arranged as cooling plates in tiers within a vacuum container (5), a plurality of pairs of semiconductors (2) arranged between the base plates via a plurality of electrodes (4) bonded to the base plates, and one layer, at least, or more of heat shielding members (7a, 7b, 7c) covering spaces above the base plates (3). The surfaces of the parts assembled to form the multistep electronic cooler are coated with a substance having a low thermal emissivity, for example, gold.

13 Claims, 5 Drawing Sheets (LOGARITHM)

| 1 |
| 2 |
| 5 |
| 11 |
| 26 |
| 64 |

(LOGARITHM)

| 1 |
| 3 |
| 8 |
| 18 |
| 42 |
| 88 |
| 208 |
| 512 |

(LOGARITHM)

| 1 |
| 3 |
| 8 |
| 18 |
| 42 |
| 88 |
| 208 |
| 512 |
| 1112 |
| 2720 |

MULTISTEP ELECTRONIC COOLER

This application is a continuation of U.S. application Ser. No. 465,258, filed as PCT/JP88/00828 on Aug. 19, 1988, now abandoned.

TECHNICAL FIELD

The present invention relates to a cascade multistep electronic cooler provided by connecting thermoelectric elements having the Peltier effect in series such that the elements are arranged tier upon tier with a base plate interposed therebetween.

BACKGROUND ART

Such multistep electronic cooler is, for example, formed in six steps as shown in FIG. 1A and contained in a vacuum bell jar 5, and on each step, a thermoelectric element A comprising a pair of N-type semiconductor 1 and a P-type semiconductor 2 is connected via an electrode 4 bonded to a base plate 3. The cooler is adapted such that, by passing electric current through the thermoelectric elements A on each step, the side of the base plate at the upper side of each step is deprived of heat, and thereby, the base plate (cooling plate) on the uppermost step, 3a, is cooled to a maximum achievable cooling temperature.

At present, as an example of such multistep electronic coolers, there is a cascade six-step electronic coolers manufactured by Marlow Industries, Inc. performance of it is as shown in FIG. 1B.

That is, the relationship between the current I and the voltage V is proportional as shown by a in FIG. 1B when the degree of vacuum in the vacuum bell jar 5 containing the electronic cooler is $10^{-6}$ Torr and the outside air temperature $T_h = 27°$ C., the relationship of the cooling temperature $T_c$ against the current I changes along a parabolic curve shown by b in the figure when incoming heat quantity Q from outside the vacuum bell jar 5 is zero, i.e., Q=0, and the cooling temperature $T_c$ when the current = 3.5 A reaches $-100°$ C. under the ideal condition of Q=0 as indicated by c in the figure, and then the cooling temperature $T_c$ rises proportionally as Q increases.

In such a multistep electronic cooler as described above, the maximum achievable cooling temperature $T_c$ under the ideal condition of the incoming heat quantity Q=0 becomes $-100°$ C. when the current I=3.5 A. In the past, however, since the cooler was just arranged to be contained in a vacuum bell jar 5, it easily suffered from the effect of the outside air temperature, and it never reached anywhere near the cooling temperature of $-100°$ C. because there was unavoidably present a certain incoming heat quantity Q.

More specifically, the incoming heat quantity Q to the multistep electronic cooler within the vacuum bell jar 5 is caused by both convective heat transfer in the vacuum bell jar 5 and radiant heat transfer from the outside. Of these heat transfers, the convex heat transfer is made noneffective by evacuating the bell jar 5. But, since the arrangement is only such that the multistep electronic cooler is contained in a vacuum bell jar 5, it was unable to prevent the external radiant heat from coming in and, hence, it was unable to reduce to zero the incoming heat quantity Q due to the radiant heat transfer.

DISCLOSURE OF THE INVENTION

The present invention has been made in view of what has been described above, and accordingly, an object of the present invention is to provide a multistep electronic cooler capable of minimizing the incoming heat quantity Q due to radiant heat transfer, not to mention that due to convective heat transfer, with a simple structure and bringing the maximum achievable cooling temperature lower than that in the conventional type at a low cost.

To achieve the above mentioned object, according to a first aspect of the present invention, there is provided a multistep electronic cooler contained in a vacuum container characterized in that it comprises one layer, at least, or more of heat shielding members disposed in the vacuum container for covering spaces above a plurality of base plates arranged as cooling plates in tiers.

According to a second aspect of the present invention, there is provided a multistep electronic cooler which is characterized in that each heat insulating member described in the first aspect is provided with heat reflecting members bonded to both inner and outer surfaces thereof.

According to a third aspect of the present invention, there is provided a multistep electronic cooler which is characterized in that each heat insulating member described in the first aspect has a window hole made at the top portion thereof.

To achieve the above mentioned object, according to a fourth aspect of the present invention, there is provided a multistep electronic cooler which is contained in a vacuum container and characterized in that surfaces of parts assembled to form the multistep electronic cooler are coated with a substance having a low thermal emissivity.

According to a fifth aspect of the present invention, there is provided a multistep electronic cooler which is characterized in that the vacuum container described in the first and fourth aspect is formed of a substance having a low thermal emissivity.

Further, according to a sixth aspect of the present invention, there is provided a multistep electronic cooler which is characterized in that the vacuum container described in the first and fourth aspect is coated with a substance having a low thermal emissivity.

Further, according to a seventh aspect of the present invention, there is provided a multistep electronic cooler which is characterized in that the substance having a low thermal emissivity described in the fourth to sixth aspect is Au, and the coating of Au is provided by adhesion, compression bonding, evaporation, plating, or the like.

The above and other objects, features, and advantages of the present invention will become apparent to those skilled in the art from the following description, in which preferred particular examples in agreement with the general concept of the present invention are shown as embodiments, and the description with reference to the accompanying drawings.

BEST MODE FOR CARRYING OUT THE INVENTION

Figure 1A:
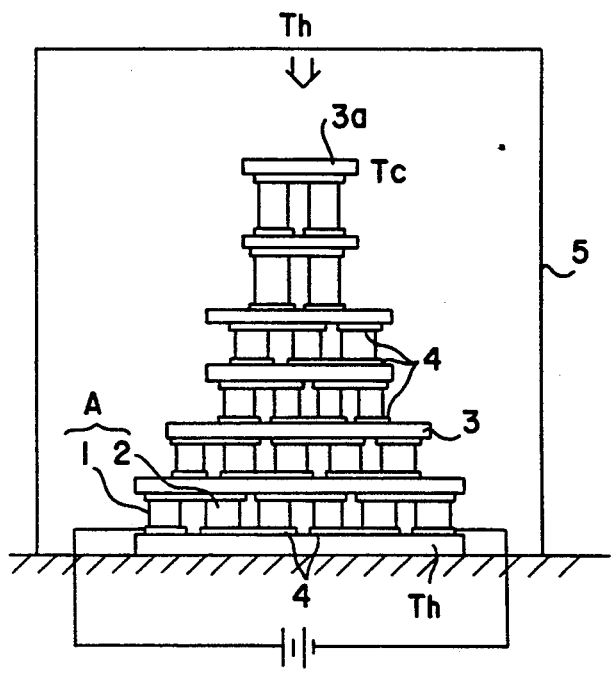
FIG. 1A is an explanatory drawing schematically showing a structure of a prior art multistep electronic cooler.

A first particular example of the present invention will be described with reference to FIG. 2. In the first particular example, corresponding members to those in the prior art example in FIG. 1A will be denoted by corresponding reference numerals and explanation thereof will be omitted.

Embodiment 1

Figure 2:
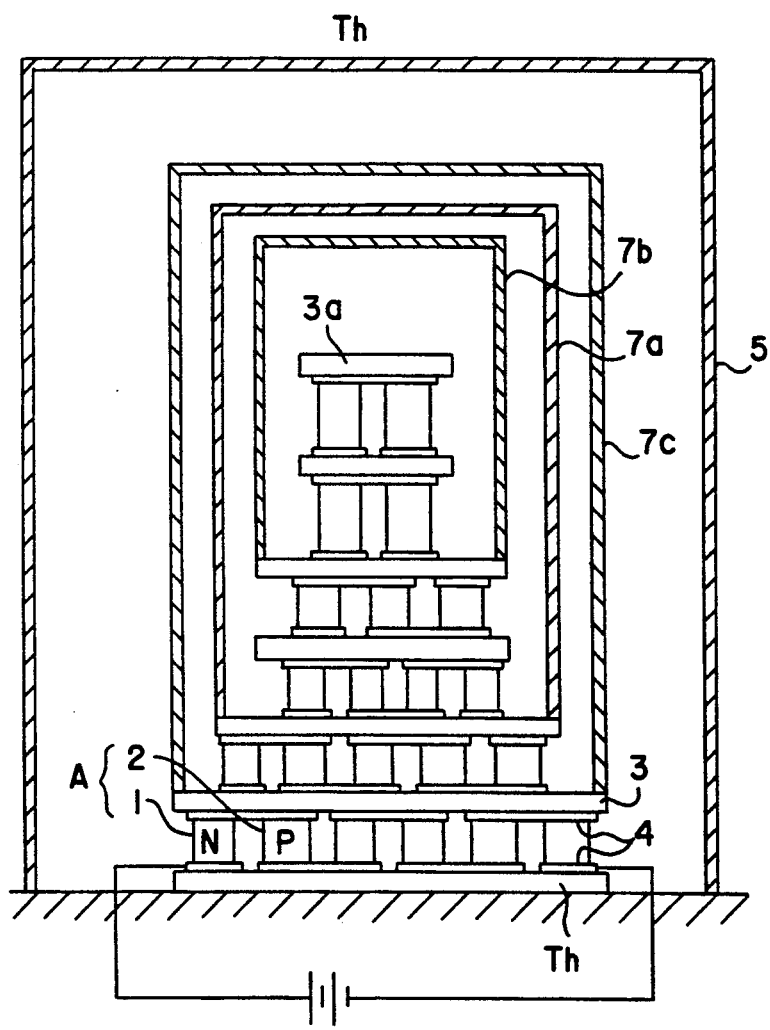
FIG. 2 is an explanatory drawing schematically showing a structure of an embodiment of the present invention of a multistep electronic cooler.

Referring to the first particular example shown in FIG. 2, the multistep electronic cooler contained in the vacuum bell jar 5 is provided with three heat shielding members 7a, 7b, and 7c for covering the space above the second step from the bottom and the spaces above upper steps. In this case, the heat shielding members 7a, 7b, and 7c are formed in boxes fixed to the base plates on the second step, third step, and fifth step from the bottom.

With the described arrangement, a D.C. current of 3 A was passed through each thermoelectric element under the conditions of the degree of vacuum within the vacuum bell jar 5 held at $2 \times 10^{-5}$ Torr, the external air temperature $T_h$ held at 27° C., and the base plate at the bottom maintained at the normal temperature (27° C.) by air cooling, liquid cooling, or the like. Then, the topmost base plate (cooling plate) 3a reached a cooling temperature of −115° C.

Comparison example 1

When an experiment was conducted under the same conditions as that for the embodiment 1 except that the heat shielding members 7a and 7b were removed, the maximum achievable cooling temperature on the topmost base plate (cooling plate) 3a was −98° C.

From these results, it was found that the maximum achievable cooling temperature in the multistep electronic cooler is improved by providing it with the heat shielding members 7a and 7b.

This can also be proved from the following reasoning.

Figure 4:
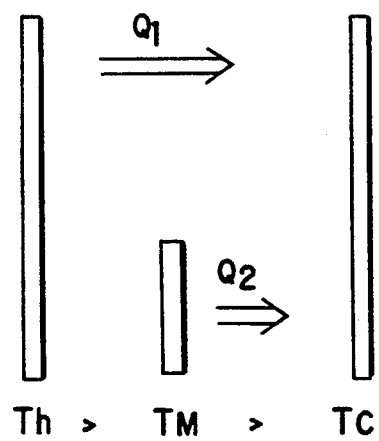
FIG. 4 is an explanatory drawing showing transferred radiant heat quantities.

More specifically, referring to FIG. 4, the radiant heat quantity is proportional to the fourth power of the temperature difference. That is, when the external air temperature is represented by $T_h$ and the maximum achievable cooling temperature with the multistep electronic cooler by $T_c$, the radiant heat quantity therebetween, $Q_1$, is expressed as $$Q_1 = C \cdot (T_h^4 - T_c^4), \text{ C: a constant.}$$

If there exists an intermediate temperature $T_m$ owing to the heat shielding members 7a and 7b provided between the external air temperature $T_h$ and the maximum achievable cooling temperature $T_c$ ($T_h > T_m > T_c$), the radiant heat quantity $Q_2$ between the intermediate temperature $T_m$ and the maximum achievable cooling temperature $T_c$ is expressed as $$Q_2 = C \cdot (T_m^4 - T_c^4),$$

hence $Q_1 > Q_2$, and from this, it is known that the incoming radiant heat quantity to the cooling plate 3a is decreased by the provision of the heat shielding members 7a, 7b, and 7c in between, and thus the better maximum achievable cooling temperature than in the comparison example is obtained in the embodiment.

Embodiment 2

The heat shielding members 7a and 7b of the multistep electronic cooler having the structure as shown in the embodiment 1 were formed of copper foil having a thickness of 12μ and then gold foil of a thickness of 1μ was bonded to both inner and outer surfaces of the heat shielding members using, as the adhesive, "ARONALPHA" (a registered tradename of a cyanoacrylate adhesive owned by Toa Gosei Chemical Industry, Co., Ltd.).

Further, as the pairs of the elements forming the thermoelectric elements A of the multistep electronic cooler, Bi-Te elements (for 6 A) were used and, as the base plate, AlN shapal metallize (0.635 mm thick) was used, and the number of pairs of the thermoelectric elements A were set to 1, 2, 5, 11, 26, and 64 from top down.

The multistep electronic cooler arranged as described above was set on a constant temperature stage and contained in a vacuum bell jar 5 made of glass.

With the above described arrangement, a current of 3.5 A was passed through the thermoelectric elements under the conditions of the vacuum within the vacuum bell jar 5 set to $2 \times 10^{-5}$ torr and the external air temperature and the constant temperature stage set to 27° C. Then, the maximum achievable cooling temperature was −118° C.

Comparison example 2

An experiment was conducted without using the heat shielding members 7a, 7b, and 7c and, otherwise, under the same conditions as for the embodiment 2 above. Then, the maximum achievable cooling temperature was −97° C.

In the above described embodiment 2, by bonding the gold foil to both inner and outer surfaces of the heat shielding members 7a, 7b, and 7c so that thermal reflection between the heat shielding members takes place, the shielding effect of the radiant heat by the heat shielding members is improved on that in the embodiment 1.

Although, in the embodiments 1 and 2 of the present invention, examples in which three heat shielding members 7a, 7b, and 7c were attached to the intermediate steps of the multistep electronic cooler have been shown, these can be one or more than three.

Figure 3:
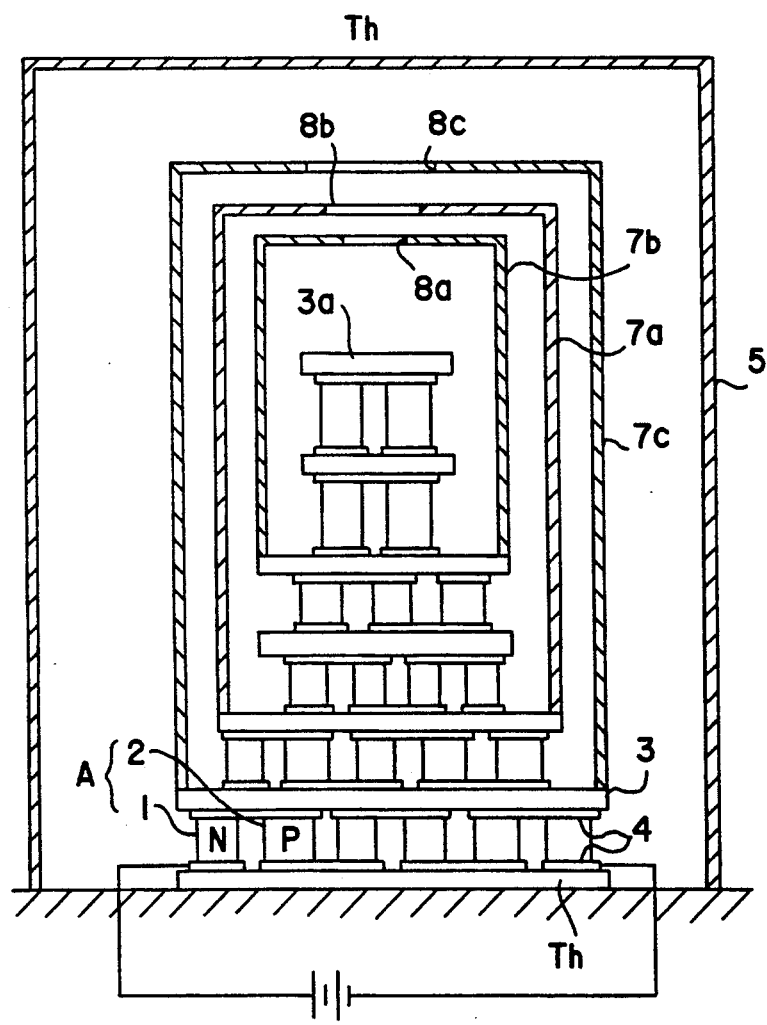
FIG. 3 is an explanatory drawing schematically showing a modification of the embodiment of the present invention shown in FIG. 2.

Further, as shown in a modified example in FIG. 3, by making windows 8a, 8b, and 8c at the top of each of the heat shielding members 7a, 7b, and 7c for introducing infrared radiation for measurement onto the topmost base plate (cooling plate) 3a, the multistep electronic cooler can be used as an infrared radiation detector.

Another embodiment of the present invention will be described below in comparison with the prior art example shown in FIG. 1.

Comparison example 3

Figure 1B:
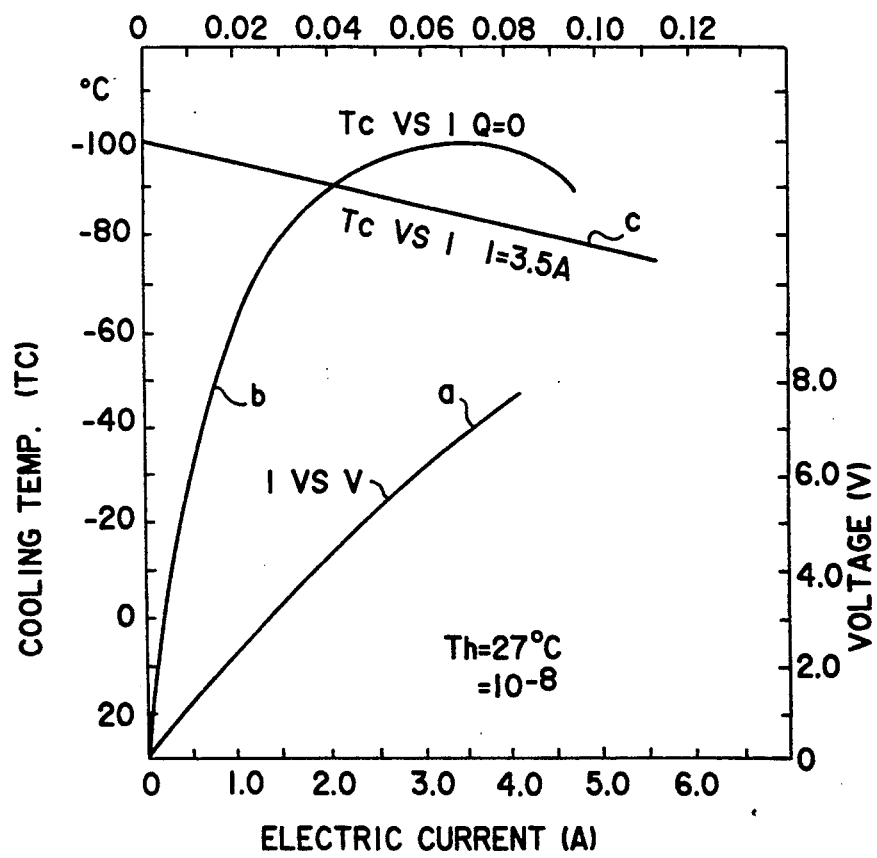
FIG. 1B is a graph showing performance of the prior art example shown in FIG. 1.

A conventional multistep electronic cooler as shown in FIG. 1, of which base plates 3 were made of AlN and pairs of elements constituting thermoelectric elements A were made of Bi-Te, was operated within a vacuum bell jar 5 made of glass, in which the degree of vacuum was $10^{-6}$ torr, when the external air temperature (room temperature) was 27° C.

The maximum achievable cooling temperature at this time was −95° C.

Embodiment 3

Foil of a thickness of 5μ was bonded to the surface of each of the base plates 3 of a multistep electronic cooler of the same form as that in the above described comparison example after it had been assembled. As a result of similar measurement made with it, −98° C. was obtained as the maximum achievable cooling temperature.

Embodiment 4

A similar measurement was made with a multistep electronic cooler being of the same form and in the same condition as that in the embodiment 3 and provided with Au plating applied to side faces of each of the thermoelectric elements A after the same were assembled. As a result of similar measurement, −101° C. was obtained as the maximum achievable cooling temperature.

Embodiment 5

Instead of the vacuum bell jar 5 made of glass in the embodiment 3, a Cu container applied with Au plating was used and similar measurement was made. The maximum achievable cooling temperature at this time was −108° C.

Thus, the maximum achievable cooling temperature in the embodiments 3 to 5 were made lower than that in the comparison example 3.

This can also be explained from the following reasoning.

More specifically, the radiant incoming heat quantity $Q_R$ to the multistep electronic cooler is expressed as $$Q_R = \sum_{i=1}^{n} E \cdot A_i \cdot (T_H^4 - T_c^4),$$

where $$E = C_S / \left( \frac{1}{\epsilon_H} + \frac{1}{\epsilon_C} - 1 \right).$$

$C_S$: Stefan-Boltzmann constant ($5.67 \times 10^{-12} W/cm^2 \cdot K^4$), $\epsilon_H$: emissivity of the high temperature portion (vacuum container), $\epsilon_C$: emissivity of each part of the cooler, $T_H$: the external air temperature (normal temperature) at the time when the cooler is operated, $T_{ci}$: temperature on the i-th step of the cooler, and $A_i$: light receiving area of the i-th step of the cooler.

Figure 8:
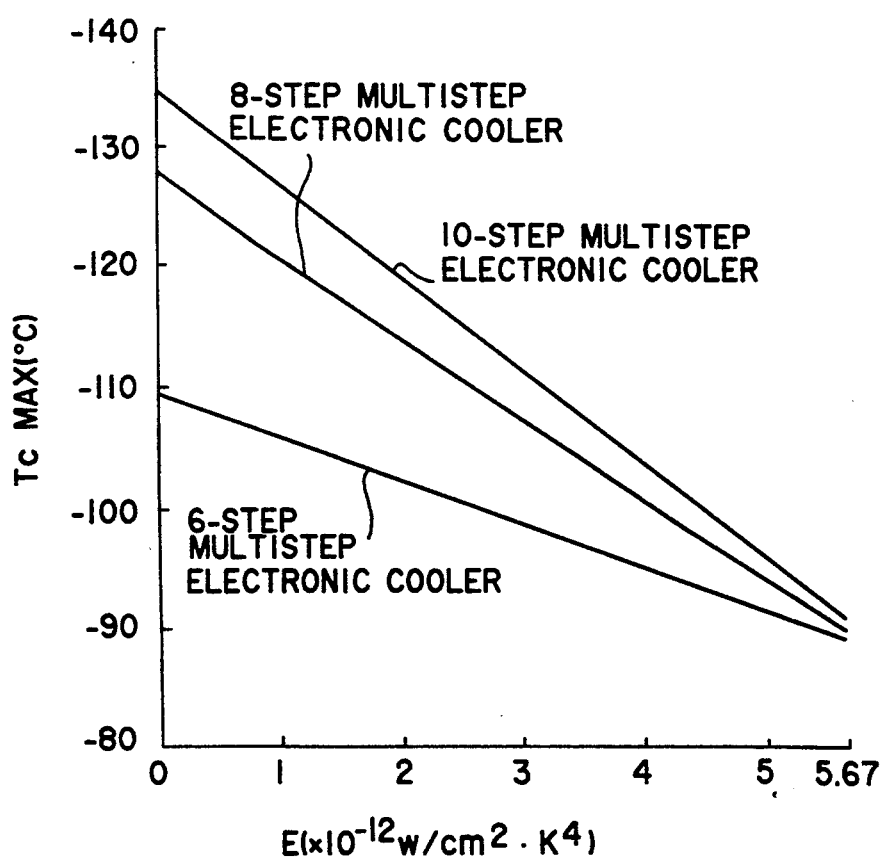
FIG. 8 is a graph showing the relationship between E and the maximum achievable cooling temperature $T_c$max with the use a cooler in the expression $E = C_s/(1/\epsilon_H + 1/\epsilon_C - 1)$, where $C_s$ is the Stefan-Boltzmann constant, $\epsilon_H$ is the thermal emissivity of the vacuum container, and $\epsilon_C$ is the thermal emissivity of each part of the cooler.
Figure 5:
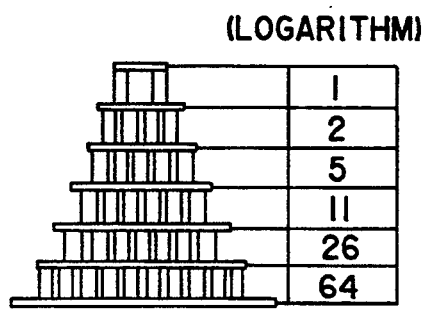
FIG. 5 to FIG. 7 are explanatory drawings respectively showing numbers of pairs of thermoelectric elements in 6-step, 8-step, and 10-step multistep electronic coolers.
Figure 6:
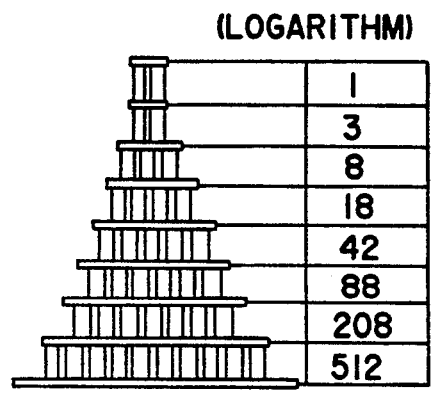
Figure 7:
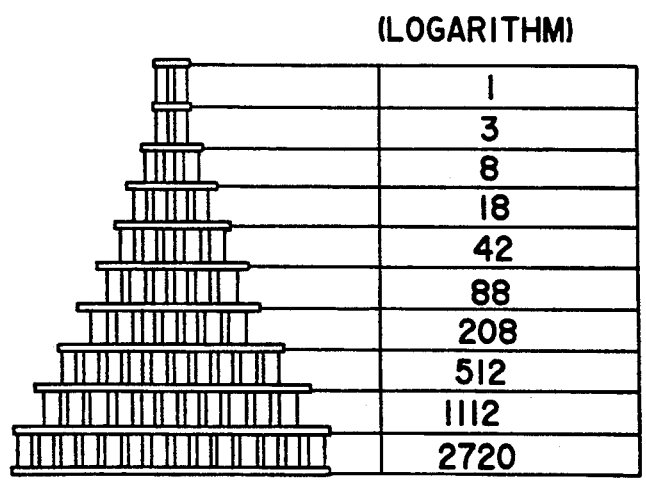

We calculated the relationship between the maximum achievable cooling temperature by each of the coolers, $T_c$max, and the value E when multistep electronic coolers of 6-step, 8-step, and 10-step types are structured as shown in FIG. 5, FIG. 6, and FIG. 7 by using thermoelectric elements A formed of Bi-Te. The results are showing in FIG. 8.

The numbers of the pairs of thermoelectric elements constituting these multistep electronic coolers are as shown in corresponding figures. The sizes of the elements used are 1.7 square×2.3 t for the 6-step type, 6 square×2.3 t for the 8-step type, and 0.6 square×2.3 t for the 10-step type.

In the calculation, values of E range from 0 to 5.67 because $\epsilon_H$ and $\epsilon_C$ each range between 0 and 1. When $E=0$ ($\epsilon_H=\epsilon_C=0$), the radiant incoming heat quantity $Q_R$ becomes zero. When $E=5.67$ ($\epsilon_H=\epsilon_C=1$), it is the case where a cooler of the perfect black body is operated in a container of the perfect black body and $Q_R$, then, reaches a maximum.

Therefore, to lower the maximum achievable cooling temperature $T_c$max of the multistep electronic cooler, it is considered effective to lower the value E by taking the following measures:

(1) To attach a substance having a low thermal emissivity to component parts of the cooler thereby decreasing $\epsilon_C$.

(2) To contain the cooler in a container made of a substance having a low thermal emissivity thereby decreasing $\epsilon_H$.

If both the measures (1) and (2) are taken, a greater effect is obtained.

In the above described embodiments 3 to 5, the multistep electronic coolers were subjected to treatments for lowering $\epsilon_C$ or $\epsilon_H$ than these in the comparison example 3. Therefore, the value E was reduced and the maximum achievable cooling temperature $T_c$max was shifted to the lower temperature side in accordance with the relationship in FIG. 8.

Values of E are estimated at E=4 for the comparison example 3, E=3 for the embodiment 3, E=2.25 for the embodiment 4, and E=0.1 for the embodiment 5.

In the multistep electronic cooler according to the present invention, the cooling effect becomes more marked as the number of cascaded steps increases. When measurements were made using 10-steps multistep electronic cooler, of which base plates were made of AlN and the thermoelectric elements were formed of Bi-Te, and operating the cooler in a vacuum bell jar made of glass, the maximum achievable cooling temperature $T_c$max was −104° C., but by having Au foil bonded onto the ceramic base plates, having Au plating applied to side faces of the thermoelectric elements formed of Bi-Te, and operating the cooler within an Au-plated container, it is presumed that the $T_c$max will reach such a low point as −134° C.

Instead of bonding Au foil as above, Au may be applied by evaporation. Further, instead of the Au-plated container made of Cu, a container made of Au may be used.

Further, the cooling effect of the multistep electronic coolers using heat shielding members as described above as the first particular example will be enhanced still more by coating surfaces of the base plates and/or the thermoelectric elements with a substance having a small thermal emissivity.

What is claimed is:

1. A multistep electronic cooler housed within a vacuum container, comprising:
   a plurality of thermoelectric elements stacked into multisteps;
   a plurality of base plates serving as cooling plates and attached on the top ends of respective steps of said thermoelectric elements; and
   a plurality of heat shield members arranged within said vacuum container and each of said heat shield members extending over at least one of said base plates for insulating the corresponding one of said base plate from external thermal load.

2. A multistep electronic cooler according to claim 1, wherein said heat shielding members are provided with heat reflecting members bonded to both inner and outer surfaces thereof.

3. A multistep electronic cooler according to claim 1, wherein each of said heat shielding members has a window hole made at the top portion thereof.

4. A multistep electronic cooler according to claim 1, wherein said heat shielding member is made of copper foil having a thickness of 12 $\mu$.

5. A multistep electronic cooler according to claim 2, wherein said heat reflecting member is made of gold foil having a thickness of 1 $\mu$.

6. A multistep electronic cooler according to claim 1, wherein surfaces of parts assembled to form said multistep electronic cooler are coated with a substance having a low thermal emissivity.

7. A multistep electronic cooler according to claim 6, wherein said substance having a low thermal emissivity is Au and the coating with Au is provided by one of adhesion, compression bonding, evaporation, and plating.

8. A multistep electronic cooler according to claim 1, wherein said vacuum container is made of a substance having a low thermal emissivity.

9. A multistep electronic cooler according to claim 8, wherein said substance having a low thermal emissivity is Au.

10. A multistep electronic cooler according to claim 1, wherein said vacuum container is coated with a substance having a low thermal emissivity.

11. A multistep electronic cooler according to claim 10, wherein said substance having a low thermal emissivity is Au and the coating with Au is provided by one of adhesion, compression bonding, evaporation, and plating.

12. A multistep electronic cooler housed within a vacuum chamber, comprising:
    a plurality of thermoelectric elements stacked to form a plurality of steps of arrays, each of the arrays of said thermoelectric semiconductor elements being formed with at least one thermoelectric semiconductor element in such a manner that the lowermost array has the largest number of said thermoelectric semiconductor elements and the uppermost array has the smallest number to have at least one thermoelectric semiconductor element;
    a plurality of base plates mounted on the tops of respective steps of said arrays of said thermoelectric semiconductor elements, said base plates serving as cooling plates for said electronic cooler, one of the base plates corresponding to said lowermost array of said thermoelectric semiconductor elements having the largest area and another one of the base plate corresponding to said uppermost array of said thermoelectric semiconductor elements having the smallest area; and
    a plurality of head shield plates having different sizes to be piled one on the other in spaced part relationship to each other for covering at least one of said base plate.

13. A multistep electronic cooler housed within a vacuum chamber, comprising:
    a plurality of thermoelectric semiconductor elements stacked to form a plurality of steps of arrays, each of the arrays of said thermoelectric semiconductor elements being formed with at least one thermoelectric semiconductor element in such a manner that the lowermost array has the largest number of said thermoelectric semiconductor elements and the uppermost array has the smallest number to have at least one thermoelectric semiconductor element;
    a plurality of base plates mounted on the tops of respective steps of said arrays of said thermoelectric semiconductor elements, said base plates serving as cooling plates for said electronic cooler, one of the base plates corresponding to said lowermost array of said thermoelectric semiconductor elements having the largest area and another one of the base plate corresponding to said uppermost array of said thermoelectric semiconductor elements having the smallest area;
    a plurality of head shield plates having different sizes to be piled one on the other in spaced apart relationship to each other for covering at least one of said base plate; and
    a thermally reflective layer formed on either sides of each of said base plate.

* * * * *